(12) United States Patent
Cheng et al.

(10) Patent No.: US 7,723,201 B2
(45) Date of Patent: May 25, 2010

(54) STRUCTURE AND METHOD FOR MAKING ON-CHIP CAPACITORS WITH VARIOUS CAPACITANCES

(75) Inventors: Kangguo Cheng, Beacon, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 877 days.

(21) Appl. No.: 11/306,718

(22) Filed: Jan. 9, 2006

(65) Prior Publication Data
US 2008/0185680 A1 Aug. 7, 2008

(51) Int. Cl.
*H01L 21/20* (2006.01)
*H01L 29/04* (2006.01)

(52) U.S. Cl. .................. 438/386; 257/627; 257/628

(58) Field of Classification Search ......... 438/243–256, 438/386–392; 257/301–302, 627–628
See application file for complete search history.

(56) References Cited

U.S. PATENT DOCUMENTS

| | | | |
|---|---|---|---|
| 5,114,827 A | | 5/1992 | Tranjan et al. |
| 5,913,118 A | * | 6/1999 | Wu .............................. 438/243 |
| 6,320,215 B1 | * | 11/2001 | Bronner et al. ............. 257/301 |
| 6,437,381 B1 | * | 8/2002 | Gruening et al. ............ 257/296 |
| 6,566,191 B2 | | 5/2003 | Hsu et al. |
| 6,680,237 B2 | | 1/2004 | Chen et al. |
| 6,759,292 B2 | | 7/2004 | Seitz et al. |
| 6,821,842 B1 | * | 11/2004 | Lee et al. ..................... 438/243 |
| 6,825,094 B2 | | 11/2004 | Wu et al. |
| 6,926,843 B2 | | 8/2005 | Cantell et al. |
| 6,936,879 B2 | | 8/2005 | Furukawa et al. |
| 6,953,961 B2 | | 10/2005 | Lee et al. |
| 6,960,503 B2 | * | 11/2005 | Hsu et al. .................... 438/243 |
| 6,960,535 B1 | | 11/2005 | Sato |
| 6,960,821 B2 | | 11/2005 | Noble et al. |
| 7,015,104 B1 | * | 3/2006 | Blanchard .................... 438/270 |
| 2005/0212027 A1 | * | 9/2005 | Adam et al. ................. 257/302 |
| 2005/0221560 A1 | | 10/2005 | Shu et al. |

* cited by examiner

*Primary Examiner*—Ori Nadav
(74) *Attorney, Agent, or Firm*—Joseph P. Abate; Greenblum & Bernstein P.L.C.

(57) ABSTRACT

A method for manufacturing a device includes forming trenches of different morphologies into a substrate. At the upper surfaces, the trenches have different orientations with respect to each other. In an aspect, windows for the trenches are aligned along the <100> and <110> directions of a silicon substrate. The trenches of different morphologies may be formed into capacitors having different capacitance levels. Also included are devices prepared by the method.

19 Claims, 6 Drawing Sheets

STRUCTURE AND METHOD FOR MAKING ON-CHIP CAPACITORS WITH VARIOUS CAPACITANCES

FIELD OF INVENTION

The invention generally relates to semiconductor devices and methods for manufacturing such devices, and more particularly to methods for forming trenches of different morphologies on such devices and to such devices comprising capacitors.

BACKGROUND DESCRIPTION

Deep trench capacitors are formed on semiconductor devices using multi-step manufacturing processes. The details of manufacturing strongly depend on the use intended for the capacitors, but generally employ the following steps. First, a trench is formed in a silicon substrate. The side walls of the trench are lined with a dielectric material, and the trench is then filled with a conductive material, e.g., a metal. The substrate acts as one plate of the capacitor, and the conductive material acts as the second plate.

Currently, semiconductor devices are being constructed that are capable of performing several different functions, each potentially operating at different speeds and requiring different RC constants of the capacitors. Thus, sometimes it is desirable to form capacitors on a substrate, where the capacitors have two or more different capacitance levels.

Where dielectric thickness of two capacitors is the same, trench size and/or morphology can have an effect on the capacitances. In semiconductor devices, it may be desirable to achieve different capacitances using the same deep trench process. For example, on a microprocessor chip, a level 2 cache of fast embedded DRAM requires smaller RC constant than a level 3 cache, which demands longer retention time and thus higher deep trench capacitance.

The capacitances of trench capacitors are affected by numerous factors, including, among others, the surface areas and morphologies of the trench bottom and sidewalls, and the type and amount of dielectric material. Accordingly, there is a need in the industry to efficiently construct a semiconductor device capable of safely accommodating capacitors of various capacitances, while maintaining a small overall device size.

One method, for example, involves formation of trench capacitors having differing dielectric thickness. This process includes, among other things, formation of trenches of differing surface area, application of a dielectric material, removal of a portion of the first dielectric material, and application of a second dielectric material. The method requires use of more than one photolithography step, which increases manufacturing cost and complexity.

Thus, current methods for manufacturing capacitors for differing capacitance and/or voltage rating require extra masks, and/or additional process steps, each of which adds to the complexity and cost of manufacture. Further, each extra mask or step increases the possibility of a flaw being introduced into the chip.

SUMMARY OF THE INVENTION

In an aspect, the invention provides a method of manufacturing a substrate having trenches in two or more morphologies. The method comprises forming on a substrate a first trench having a first aspect ratio and a first orientation and forming on the substrate a second trench having a second aspect ratio and a second orientation different from the first orientation. At least one of the first and second aspect ratios is greater than 1.

In another aspect, the invention provides a chip comprising at least a first and a second capacitor manufactured by forming a first trench having a first aspect ratio and a first orientation and a second trench having a second aspect ratio and a second orientation different from the first orientation. At least one of the first and second aspect ratios is greater than 1. The first and second capacitors are formed into first and second trenches.

In another aspect, the invention provides a chip comprising at least a first and a second capacitor, wherein the first and second capacitors are respectively in first and second trenches in the chip. The chip comprises a substrate having an upper surface. A cross section of the first trench at the upper surface has a first aspect ratio and a first orientation and a cross section of the second trench at the upper surface has a second aspect ratio and a second orientation different from the first orientation. At least one of the first and second aspect ratios is greater than 1.

DETAILED DESCRIPTION OF EMBODIMENTS OF THE INVENTION

The invention generally relates to semiconductor devices and methods for manufacturing such devices, and more particularly to methods for forming trenches of different morphologies on such devices and to such devices comprising capacitors formed by the trenches. In one aspect of the invention, the invention includes a method for fabricating substrates with differing trench morphologies in order to provide, for example, capacitors with differing capacitance. The invention further includes a method for forming two or more types of capacitors (e.g., different capacitance and/or trench morphology) without the need for additional process steps. In aspects of the invention, the structure of the device includes on-chip capacitors with different capacitance levels and/or morphologies.

Figure 1:
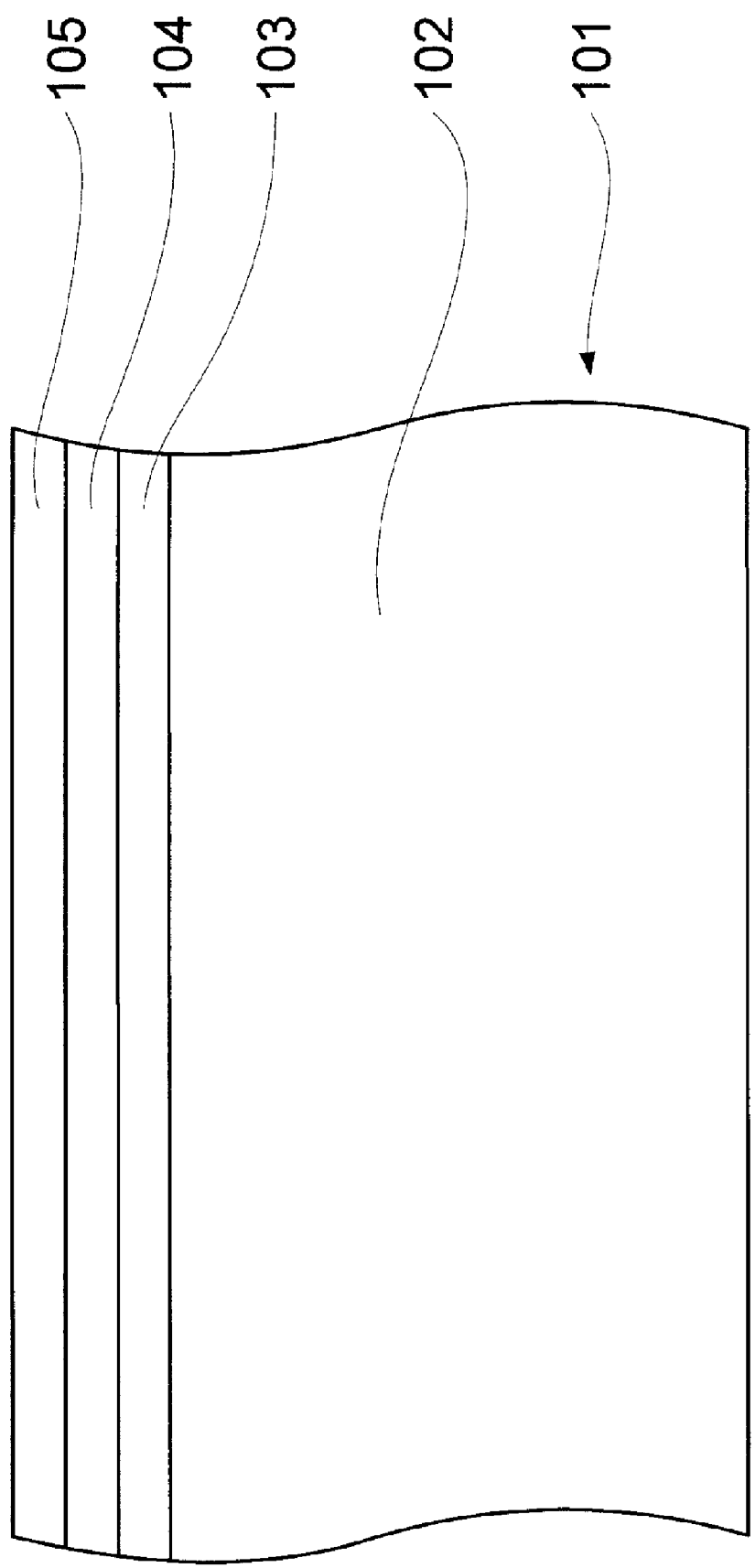
FIG. 1 illustrates a beginning structure for forming trenches in a substrate according to the present invention.

FIG. 1 shows a beginning structure denoted generally by reference numeral 101. The structure 101 includes a substrate 102. The substrate 102 has formed upon it pad layer 103, hardmask layer 104, and photoresist layer 105. The substrate 102 can be any material suitable for use in a semiconductor. Typically, this will be silicon that may be doped with P- or N-type dopants. When the substrate is silicon, the substrate may be a monolithic crystal, which may be oriented such that the upper surface is the (001) crystal plane.

The pad layer 103 may be any typical material. Typically, the pad layer 103 comprises oxide and/or nitride. A pad oxide layer is typically about 2-10 nm thick, and a pad nitride layer is typically about 100-200 nm thick. In aspects, the pad layer may be a pad nitride with an optional underlying oxide. The pad layer 103 may be formed by any method by those of ordinary skill in the art any deposition method, such as sputtering. The hardmask layer 104 may be any typical material. For example, the hardmask layer 104 may comprise oxide, and may be 500-2000 nm thick. The hardmask layer 104 may be applied by any method by those of ordinary skill in the art, such as, for example, sputtering. The photoresist layer 105 may be of the positive or negative type. Some typical photoresists include those comprising novolac resins, and solvents such as propylene glycol methyl ether acetate or 2-ethoxy ethyl acetate, to which one or more photosensitive compounds such as diazonapthoquinones have been added. The photoresist layer 105 may be applied by any method by those of ordinary skill in the art.

Figure 2:
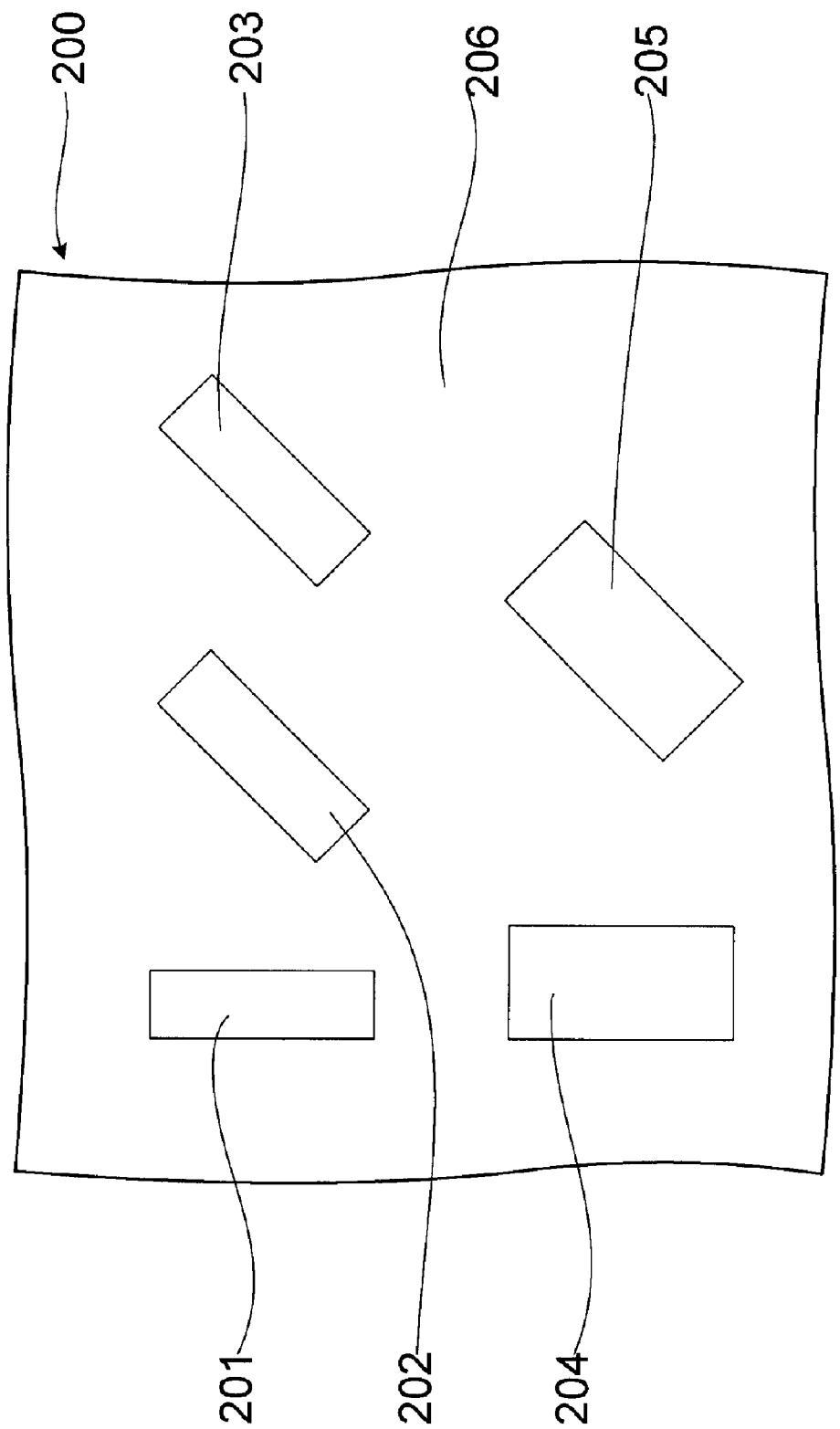
FIG. 2 schematically illustrates an embodiment of a design mask for forming windows according to the present invention.

FIG. 2 shows a sample design mask according to the present invention. The design mask may determine the shapes, sizes, locations and orientations of the windows to be formed in the photoresist layer 105. In embodiments, the design mask is generally denoted by reference numeral 200, and contains a set of "design shapes," 210-205, often fabricated on glass plates or other appropriate material. The design mask includes opaque and transparent parts which represent all, or portions of, the predetermined pattern of trenches which are to be formed on a chip. In many such techniques, the mask is applied to the base, or chip, to be patterned after the substrate has been coated with pad layer, a hardmask layer, and a photoresist layer.

Referring still to FIG. 2, the design mask 200 comprises a plurality of design shapes 201-205. The design shapes, e.g., windows, may be of any shape, and in certain embodiments are oblong. Oblong shapes include rectangles and/or ovals, e.g., ellipses.

The ratio of the long axis of the oblong to the short axis is the aspect ratio, n, of the design shape. Thus, the dimensions of the design shape may be expressed in the format FxnF. The surface area of the design shape and/or trench cross section at the substrate surface depend largely on the use to which a chip is intended, and is not particularly critical to the present invention. A trench that is too small may be difficult to form, and a trench that is too large may lead to reduced capacitor density (i.e., larger trenches mean fewer capacitors will fit in a given surface area of the substrate). In an embodiment, the design shapes and/or the trench cross sections at the substrate surface, have essentially the same shapes, but different orientations. Appropriate surface areas may be determined by those of ordinary skill in the art for the particular chip being designed.

In aspects of the invention, aspect ratios n may be greater than about 1.2 or 1.5 and/or less than about 5 or 2, e.g., in ranges of about 1.2-5 or about 1.5-2. Typical values of F are greater than about 50 or 100 nm, and/or less than about 500 or 200 nm, e.g., in the ranges of about 50-500 nm, or about 100-200 nm. It should be understood, though, that other shapes and ratios are also contemplated by the invention.

Directionality or orientation may be defined for any design shape that is not circular. For a design shape, or trench cross section, that is, e.g., oblong, elliptical or oval, the orientation may be defined as along the direction of the long axis. For the purposes of the present invention, a circular design shape is defined as having a different orientation from any non-circular design shape.

It should be understood that any aspect ratio that provides a trench of useful morphology might be used with the invention. For example, an aspect ratio of n=1 corresponding to, e.g., somewhat square or circular shapes, may be implemented with the invention. The two or more windows 201-205 may have the same or different aspect ratios. Where one aspect ratio is used, it should be greater than 1, or greater than 1.1. Where two or more aspect ratios are used, no more than one of the aspect ratios should be 1. In embodiments, no aspect ratios are about 1, e.g., both aspect ratios (which may be different) are greater than about 1, or greater than about 1.1.

Without limiting the present invention, the design shapes 201 and 204 in the design mask 200 have different aspect ratios and surface areas, and are oriented in the same direction. The design shapes 202 and 203 have substantially the same area and aspect ratio as each other, and are oriented at an angle, e.g., 45°, relative to design shapes 201 and 204. That is, the design shapes 201 and 204 are rotated with respect to the design shapes 202 and 203, respectively. In one non-limiting illustrative implementation, the design shapes 202 and 203 can be referred to as normal orientation; whereas, the design shapes 201 and 204 can be referred to as rotated.

The design shape 205 has the same orientation as design shapes 202 and 203, but has a different surface area and aspect ratio. In other aspects of the invention, the design shapes 201-205 may be oriented in any direction so long as at least two different orientations are used in the design mask 200.

Where a positive photoresist is employed, the design shapes 201 to 205 will typically be transparent, and other portions 206 of design mask 200 will typically be translucent or opaque. Where a negative photoresist is employed, design shapes 201 to 205 will typically be translucent or opaque, and other portions 206 of design mask 200 will typically be transparent. Those of ordinary skill in the art using any appropriate materials and methods can manufacture the design mask 200.

Figure 3:
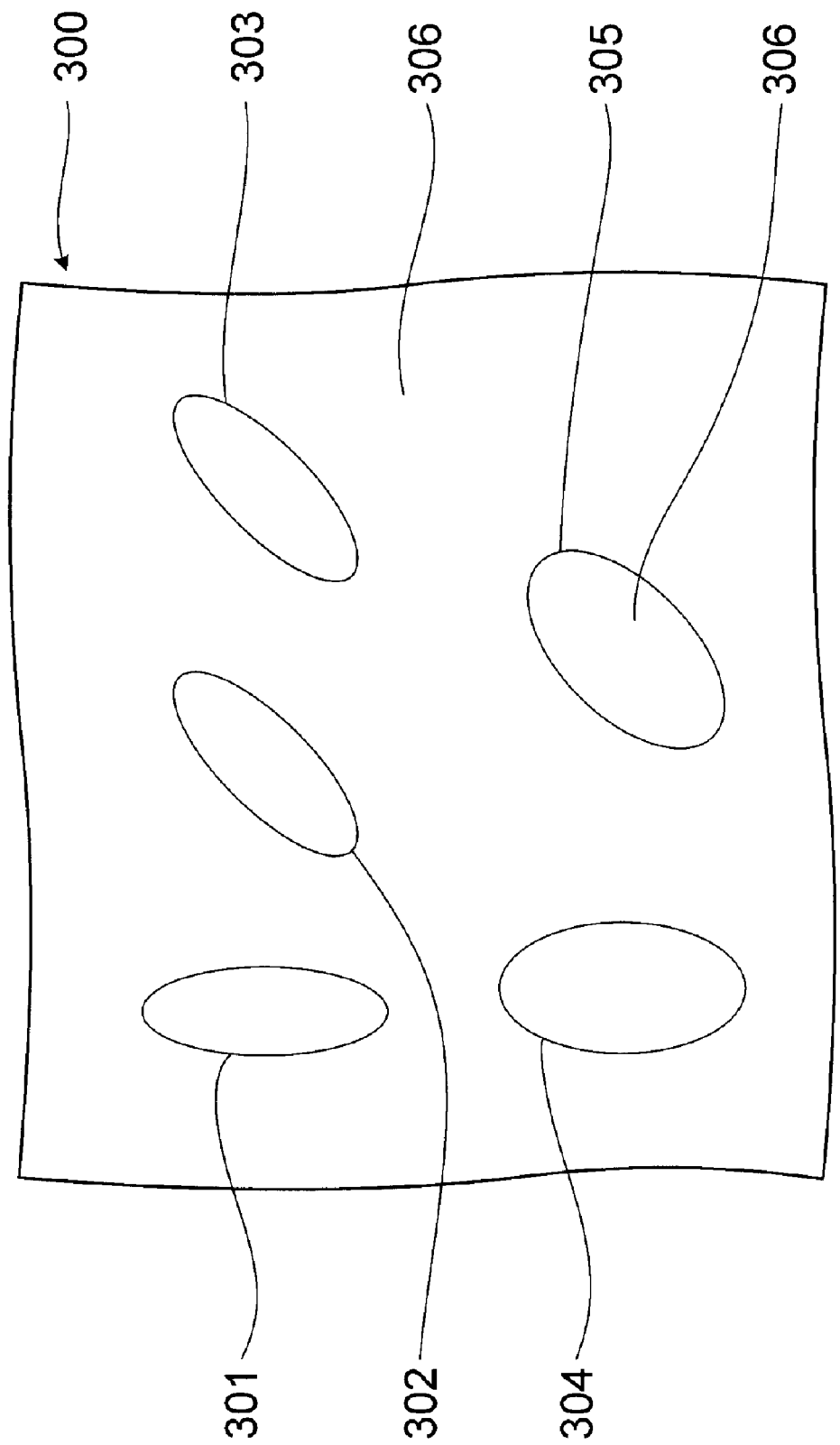
FIG. 3 is a top view of a chip printed using the type of mask shown in FIG. 2.

FIG. 3 shows windows formed in the substrate using the design mask of FIG. 2. As shown, windows 301-305 are formed in a photoresist layer 300 using the design mask 200, using a same processing step. For example, the windows 301-305 are formed by exposing the photoresist layer 300 through the design mask. Thus, the windows 301-305 correspond substantially in orientation to the respective design shapes 201-205.

The windows 301-305 generally have rounded corners, and are more nearly oval or elliptical in shape; however, the windows 301-305 may be other shapes corresponding to shapes in the design mask 200. The windows 301-305 expose portions of hardmask layer 104. In an aspect of the invention, windows have two orientations directed at 45 degrees with respect to each other. Other angles of separation may also be used, depending on the shapes of the design shapes 201-205.

In an aspect of the invention, the surface of the substrate, e.g., a crystalline silicon substrate, is the (001) crystal plane. During the photolithography step, the design mask is oriented relative to the substrate such that one window orientation is along the <110> direction of the substrate, and another window orientation is along the <100> direction. Orientations along the directions of other crystal planes are also contemplated by the invention. Those of ordinary skill in the art can determine angles of crystal directions for other silicon substrates. In aspects of the invention, two window orientations are used; although three or more window orientations are also contemplated by the invention.

Figure 4:
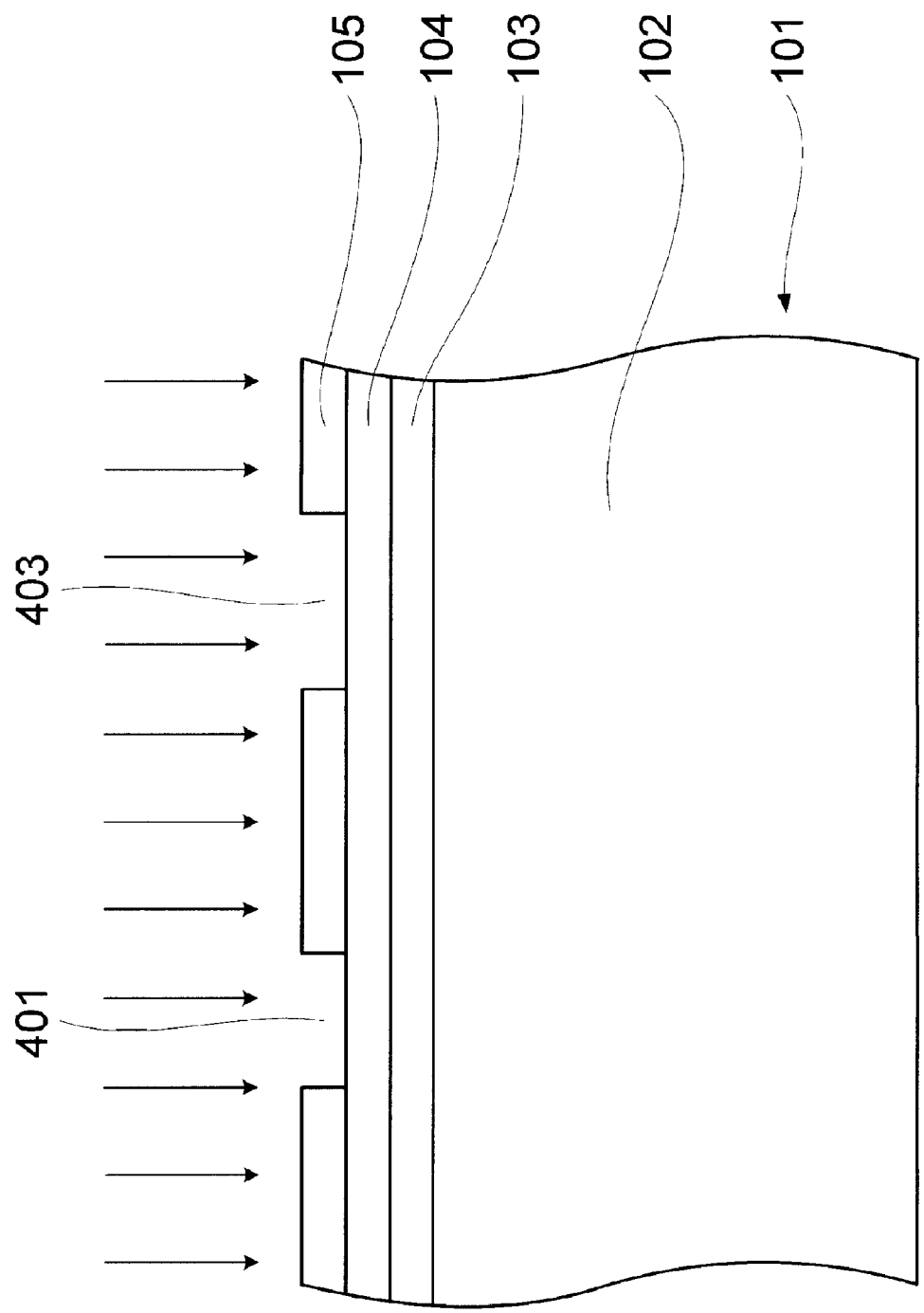
FIG. 4 illustrates a substrate with windows prepared for forming trenches according to the present invention.

FIG. 4 shows a sectional side view of the substrate and overlayers after printing of the photoresist. For illustrative purposes, FIG. 4 only shows two opening 401 and 403 in the photoresist layer 105; although, it should be understood that other trenches may be formed in the chip. The openings 401 and 403 will substantially correspond in shape and size to the windows of the design mask, 201 and 203. In one embodiment, the openings 401 and 403 will be oriented at a 45 degree angle with respect to each other; although other angles are also contemplated by the invention. It is contemplated, though, that at least two openings are oriented at different angles. The chip includes the layering of FIG. 1, which includes for example, a substrate 102 overlaid by pad 103, hardmask 104, and photoresist layer 105.

FIG. 4 further represents an etching process to form trenches substantially corresponding in shape, size and orientation to the openings 401 and 403, e.g., normal and rotated trenches). The trenches can be formed, or etched, using any method by those of ordinary skill in the art. For example, the etching may be carried out using a reactive ion etch (RIE), a high-density plasma (HDP) etch and an etchant gas mixture, such as a gas containing fluorine atoms, or by any other method by those of ordinary skill in the art. The downward arrows in FIG. 4 schematically represent this process step.

Figure 5:
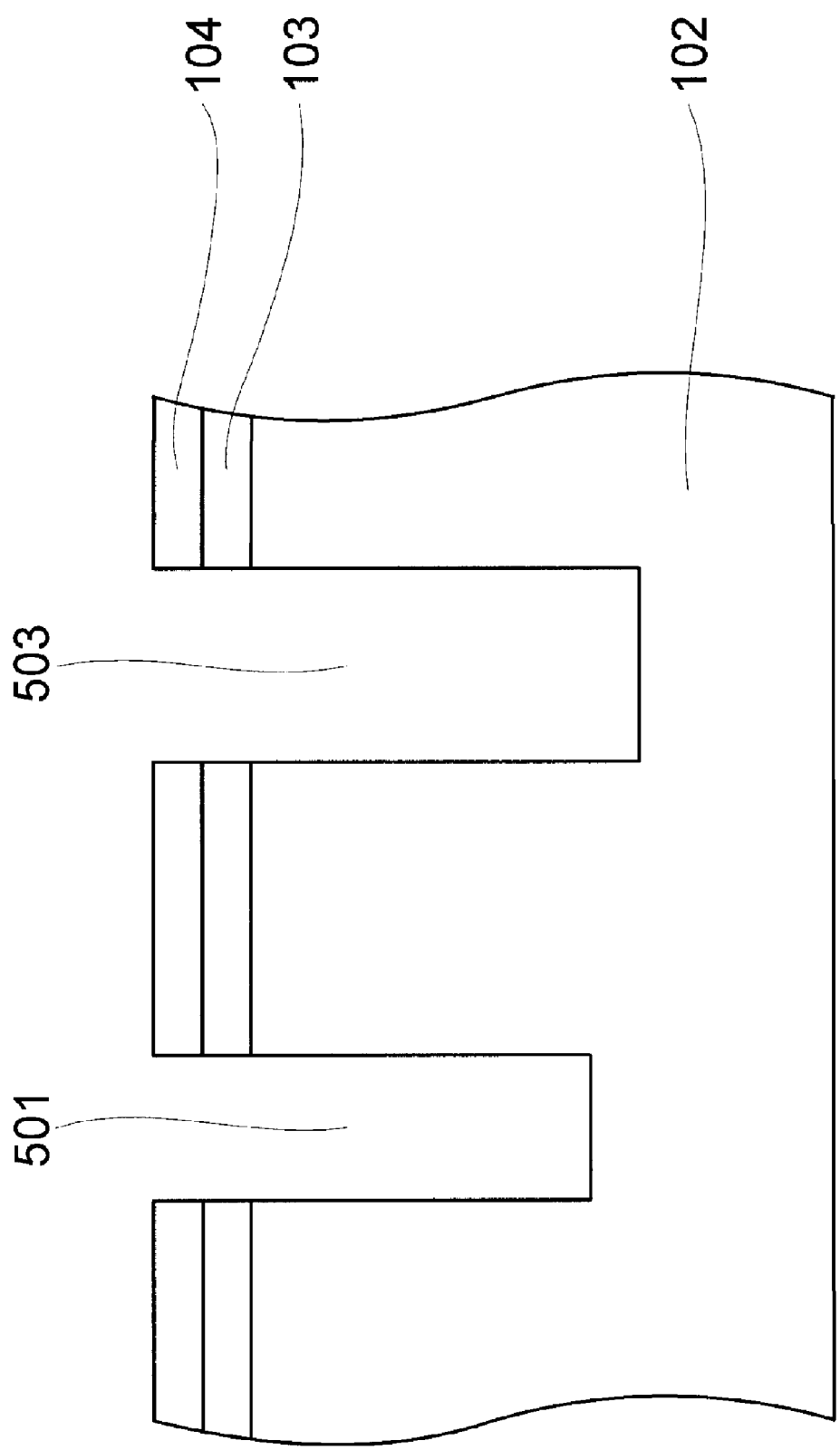
FIG. 5 illustrates a substrate having two trenches formed therein.

FIG. 5 illustrates the formation of trenches, represented by reference numerals 501 and 503. The trenches 501 and 503 are formed in the substrate 102 pad layer 103 and hard mask 104. The hardmask 104, in processing steps, may be etched away. The trenches 501 and 503 substantially correspond in shape, size and orientation to the openings 401 and 403, respectively, which, in turn, correspond to respective windows and openings in the photoresist and design mask. The trenches are thus considered normal and rotated trenches.

In one embodiment, the trenches will be oriented along the <110> and the <100> directions in the (001) plane, respectively, resulting from the initial orientation of the windows in the design mask. Those of ordinary skill in the art should understand that the trenches might also be oriented along other directions of the substrate, resulting from different shapes, orientations and sizes of the windows in the design mask. The trenches can then be formed into capacitors—such by filling with metal—resulting in different capacitance, mainly due to the different orientations, e.g., resulting shapes, as described in more detail below.

Figure 6:
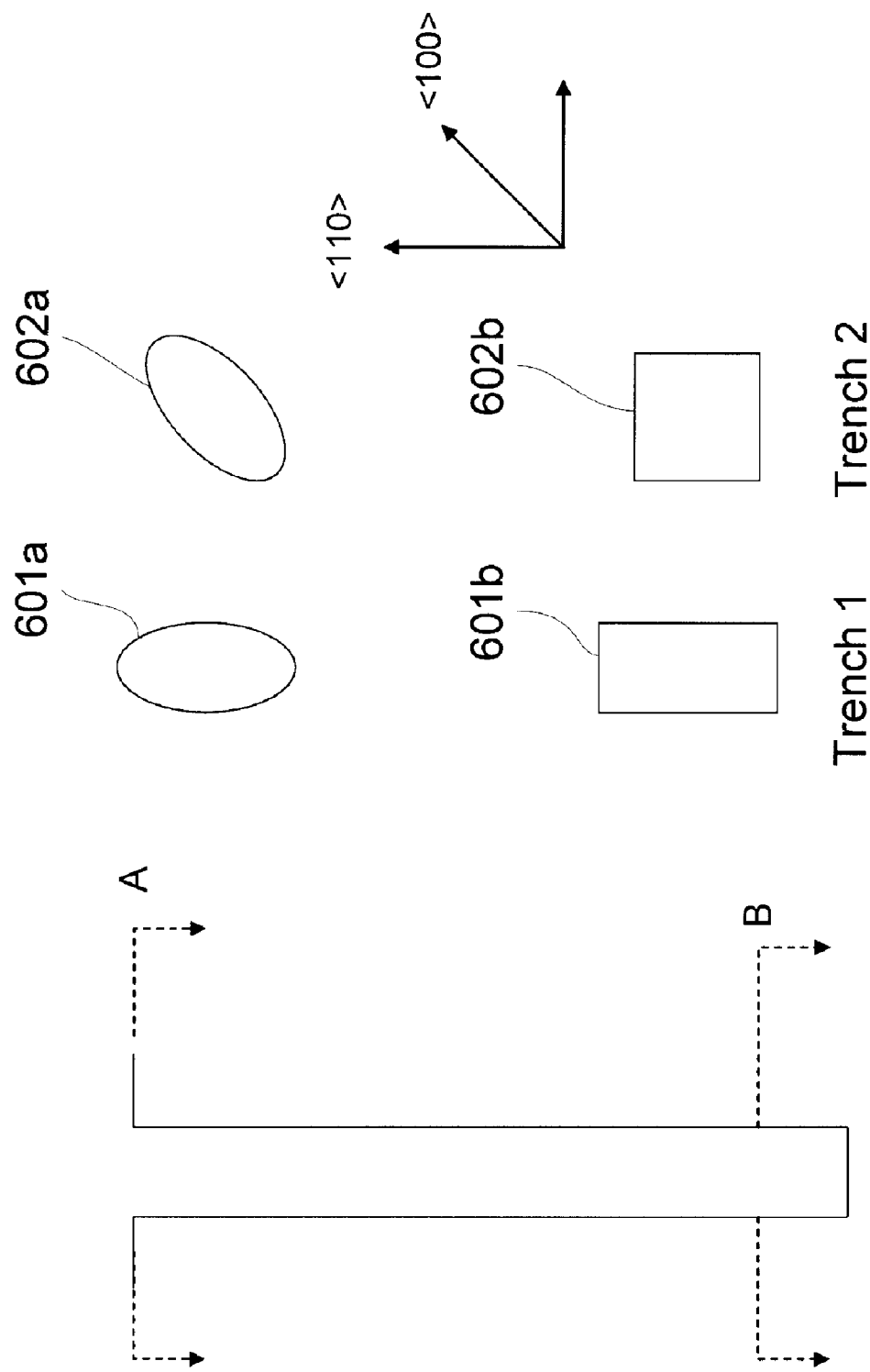
FIG. 6 illustrates morphologies of trenches according to the present invention.

To more fully explain the present invention, as seen in FIG. 6, a window that is oriented along the silicon <110> plane at the substrate upper surface, having cross section 601a at level A, forms a trench with somewhat rectangular bottom cross section 601b at level B. On the other hand, a window that is oriented along the silicon <100> plane at the substrate upper surface, having cross section 602a at level A, forms a trench with somewhat square bottom cross section 602b at level B. Thus, use of different window orientations result in trenches whose shapes differ with increasing depth, i.e., trenches with different morphologies. Trenches with different shapes and/or morphologies should have different capacitances. By forming the trenches into capacitors, the capacitance levels will vary due to the different shapes.

Trenches can be formed into capacitors by any method by those of ordinary skill in the art. In general, trenches may be formed into capacitors by depositing a dielectric material inside the trenches, then filling the trenches with an electrically conductive material, e.g., a metal. Any remaining hardmask is generally stripped, either before or after capacitor formation. The person of ordinary skill in the art is able to select appropriate materials and methods for applying the dielectric material, for filling the trenches, and for removing any remaining hardmask.

In aspects, the present invention provides a unified process for manufacturing on-chip capacitors having different capacitances. In this aspect, the inventive method does not require extra manufacturing steps for manufacturing the trenches and/or capacitors. For example, only one mask is required, and only one etching step is required.

In aspects, the present invention provides a method for forming trenches of different morphologies in a single process steps. In an embodiment, windows for trenches of different morphologies may be formed in, e.g., a photoresist layer, in a single step, without the need for a plurality of design masks and/or application of a plurality of photoresist layers. In an embodiment, trenches of different morphologies may be etched in a single step, e.g., a single RIE step.

In other aspects, the inventive method may be combined with other process steps to impart desired characteristics to the capacitors so formed. For example, the inventive method would include a process that forms windows and/or trenches of different orientations, even if the process also includes a plurality of, e.g., window-forming steps and/or trench etching steps.

In aspects of the invention, two or more capacitors according to the present invention have different capacitance levels in the same chip, formed using same processing steps of the invention. Any trench capacitance may be formed with the present invention. In embodiments, the capacitance of trench capacitors is strongly dependent on the orientations and/or aspect ratios, and less dependent on the design shape. Typically, capacitances of capacitors according to the present invention are greater than about 5, 10, or 15 femptofarads (fF), and/or are less than about 200, 100, or 50 fF, and, therefore, include the ranges of, e.g., about 5-200 fF, 10-100 fF, or 15-50 fF. The capacitance levels can vary to any extent. In embodiments, the lower capacitance may be 5-40% less than the higher capacitance, that is, the capacitances of the two capacitors may differ by 5-40%. Measurement of capacitance is routine, and can be performed by those of ordinary skill in the art using any appropriate method.

While the invention has been described in terms of embodiments, those skilled in the art will recognize that the invention can be practiced with modification within the spirit and scope of the appended claims.

What is claimed is:

1. A method of manufacturing a substrate having trenches in two or more morphologies, the method comprising:
    forming on a substrate, a first trench having a first aspect ratio and a first orientation along a <110> direction of a crystalline orientation of the substrate in a (001) plane; and
    forming on the substrate a second trench having a second aspect ratio, and a second orientation along a <100> direction of the crystalline orientation of the substrate in the (001) plane, the second orientation being different from the first orientation;
    wherein at least one of the first and second aspect ratios is greater than 1.

2. The method of claim 1, wherein the substrate comprises crystalline silicon, and the surface of the substrate comprises the (001) plane.

3. The method of claim 2, wherein the first and second aspect ratios are each in the range of about 1.2-5.

4. The method of claim 1, wherein the first and second aspect ratios are each in the range of about 1.2-5.

5. The method of claim 1, wherein the trenches are formed by reactive ion etching.

6. The method of claim 1, further comprising:
    forming a pad layer on at least a portion of the substrate;
    forming a hardmask layer on at least a portion of the pad layer;
    forming a photoresist layer formed on at least a portion of the hardmask layer;

forming windows of different orientations in the photoresist layer, for the first and second trenches, in a single processing step; and etching the hardmask layer, the pad layer and the substrate corresponding to the first and second wenches in the substrate.

7. The method of claim 6, further comprising forming the first and second trenches respectively into first and second capacitors.

8. The method of claim 1, further comprising forming the first and second trenches respectively into first and second capacitors.

9. The method of claim 8, wherein the first and second capacitors differ in capacitance by about 5-40%.

10. The method of claim 1, wherein the forming of the first trench and second trench are formed simultaneously.

11. The method of claim 1, wherein the first orientation of the first trench is formed at a 45 degree angle with respect to the second trench.

12. The method of claim 1, wherein the first trench oriented along the <110> direction is formed with a first cross section at a first level and a second cross section at a second level, wherein the second cross section is different from the first cross section.

13. The method of claim 12, wherein the first cross section is oval and the second cross section is rectangular.

14. The method of claim 12, wherein the second trench oriented along the <100> direction is formed with a first cross section at a first level and a second cross section at a second level, wherein the second cross section of the second trench is different from the first cross section of the second trench.

15. The method of claim 14, wherein the first cross section is oval and the second cross section is square.

16. The method of claim 14, wherein the first trench and the second trench have shapes differing with increasing depth.

17. A method of manufacturing a substrate having trenches, the method comprising:
    forming simultaneously on a substrate:
        a first trench having a first orientation along a <110> plane of a crystalline orientation of the substrate, and having first shape; and
        a second trench having a second orientation alone a <100> plane of the crystalline orientation of the substrate, and having second shape,
    wherein the second orientation and second shape being different from the first orientation and the first shape, respectively.

18. The method of claim 17, wherein:
    the first trench oriented along the <110> plane is formed with a first cross section at a first level and a second cross section at a second level, the second cross section of the first trench is different from the first cross section of the first trench, wherein the first cross section is oval and the second cross section is rectangular; and
    the second trench oriented along the <100> plane is formed with a first cross section at a first level and a second cross section at a second level, the second cross section of the second trench is different from the first cross section of the second trench, wherein the first cross section is oval and the second cross section is square.

19. The method of claim 18, wherein the first trench and the second trench have shapes differing with increasing depth.

* * * * *